US011522391B2

United States Patent
Li et al.

(10) Patent No.: US 11,522,391 B2
(45) Date of Patent: Dec. 6, 2022

(54) METHOD AND APPARATUS FOR DETECTING OBJECTS IN CHARGING AREA OF WIRELESS CHARGING TRANSMITTER

(71) Applicant: NXP USA, Inc., Austin, TX (US)

(72) Inventors: Gang Li, Shanghai (CN); Ping Zhao, Shanghai (CN); Fei Chen, Shanghai (CN)

(73) Assignee: NXP USA, Inc., Austin, TX (US)

( * ) Notice: Subject to any disclaimer, the term of this patent is extended or adjusted under 35 U.S.C. 154(b) by 338 days.

(21) Appl. No.: 15/702,754

(22) Filed: Sep. 12, 2017

(65) Prior Publication Data
US 2018/0375385 A1 Dec. 27, 2018

(30) Foreign Application Priority Data
Jun. 22, 2017 (CN) .......................... 201710483561.5

(51) Int. Cl.
| | | |
|---|---|---|
| *H02J 50/60* | (2016.01) | |
| *H02J 50/90* | (2016.01) | |
| *H02J 50/80* | (2016.01) | |
| *H02J 50/12* | (2016.01) | |
| *H03K 5/156* | (2006.01) | |
| *H02J 50/10* | (2016.01) | |
| *H02J 50/20* | (2016.01) | |

(52) U.S. Cl.
CPC .............. *H02J 50/60* (2016.02); *H02J 50/12* (2016.02); *H02J 50/80* (2016.02); *H02J 50/90* (2016.02); *H03K 5/156* (2013.01); *H02J 50/10* (2016.02); *H02J 50/20* (2016.02)

(58) Field of Classification Search
CPC .................................. H02J 50/90; H02J 50/60
USPC .......................................................... 320/108
See application file for complete search history.

(56) References Cited

U.S. PATENT DOCUMENTS

| | | | |
|---|---|---|---|
| 8,983,374 B2 | 3/2015 | Wiley | |
| 9,178,387 B2 | 11/2015 | Mohammadian et al. | |
| 9,450,648 B2 | 9/2016 | Bastami | |
| 2012/0235636 A1* | 9/2012 | Partovi | H02J 5/005 320/108 |
| 2012/0256620 A1* | 10/2012 | Oettinger | H02J 50/10 324/239 |
| 2013/0241300 A1* | 9/2013 | Miyamoto | H01F 5/003 307/104 |
| 2013/0241304 A1* | 9/2013 | Bae | H04B 5/0037 307/104 |
| 2013/0257168 A1 | 10/2013 | Singh | |

(Continued)

FOREIGN PATENT DOCUMENTS

WO WO-2018004117 A1 * 1/2018 ........... H01F 27/288

*Primary Examiner* — David V Henze-Gongola
*Assistant Examiner* — Tarikh Kanem Rankine

(57) ABSTRACT

A method for detecting objects in a charging area of a wireless charging transmitter includes providing a bridge circuit that generates a ping signal, and providing the ping signal to a transmitter terminal. The method further includes monitoring at least one of a current of a power supply connected to the bridge circuit, and a current at the transmitter terminal to determine if an eligible object is in the charging area. The ping signal has parameters including frequency, duty cycle, and phase shift angle, where at least one of these parameters varies with time.

21 Claims, 4 Drawing Sheets

(56) References Cited

U.S. PATENT DOCUMENTS

| | | | |
|---|---|---|---|
| 2014/0091626 A1* | 4/2014 | Walley | H02J 7/0004 |
| | | | 307/43 |
| 2014/0094116 A1* | 4/2014 | Walley | H02J 50/12 |
| | | | 455/41.1 |
| 2014/0333145 A1 | 11/2014 | Lee et al. | |
| 2014/0361738 A1 | 12/2014 | Lee et al. | |
| 2015/0180267 A1* | 6/2015 | Romanelli | A01K 11/006 |
| | | | 320/108 |
| 2015/0194814 A1* | 7/2015 | Taylor | H04B 5/0037 |
| | | | 307/31 |
| 2015/0318708 A1 | 11/2015 | Bartlett | |
| 2015/0380978 A1* | 12/2015 | Toivola | H02J 50/12 |
| | | | 320/108 |
| 2016/0013658 A1* | 1/2016 | Kohara | H02J 50/12 |
| | | | 307/104 |
| 2016/0181874 A1* | 6/2016 | Raveh | H02J 50/80 |
| | | | 307/104 |
| 2016/0190852 A1 | 6/2016 | Chiang et al. | |
| 2016/0254705 A1* | 9/2016 | Jung | H02J 50/40 |
| | | | 307/104 |
| 2016/0268842 A1* | 9/2016 | Wang | H02J 50/12 |
| 2016/0282499 A1* | 9/2016 | Miyamoto | G01N 27/72 |
| 2017/0018965 A1* | 1/2017 | Lee | H02J 50/80 |
| 2017/0025895 A1* | 1/2017 | Hayashida | H02J 7/025 |
| 2017/0141818 A1* | 5/2017 | Umeda | H02J 7/025 |
| 2018/0062443 A1* | 3/2018 | Cho | H02J 7/045 |
| 2019/0214852 A1* | 7/2019 | Park | H02J 50/40 |
| 2019/0310388 A1* | 10/2019 | Park | H02J 50/12 |

* cited by examiner

METHOD AND APPARATUS FOR DETECTING OBJECTS IN CHARGING AREA OF WIRELESS CHARGING TRANSMITTER

BACKGROUND

The present invention generally relates to a method and apparatus for detecting objects in a charging area of a wireless charging transmitter and, more particularly, to a method and apparatus that prevents a large current from being generated by the wireless charging transmitter.

Induction based wireless charging has become a very popular feature for consumer electronic devices. An induction based wireless charging system typically includes a transmitter (Tx) that provides charging power. In order to detect an eligible object, i.e., a receiver (Rx), the transmitter employs an analog ping to detect the presence of an object on its surface. The analog ping usually includes a number of pulses triggered in a short period of time. The transmitter then uses a digital ping with continuous pulses to determine if the detected object is an eligible receiver.

Metal objects like coins, phones with metal back shells, lithium batteries, etc. can be occasionally placed in the charging area. If the metal object is large enough in size, the transmitted analog/digital ping signal may result in a large current at the transmitter. This large current can damage the transmitter, cause a loud noise to be generated, or heat the metal object. Thus, the transmitter needs over current protection. However, present over current protection systems do not prevent the occurrence of the large current. Moreover, because the analog ping signal is usually quite short, the over current protection does not take effect for the analog ping signal.

It would be advantageous to prevent large currents from being generated by the analog and/or digital ping signals.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a method for detecting objects in a charging area of a wireless charging transmitter. The method includes supplying a bridge circuit with power from a power supply; generating a ping signal by the bridge circuit; and providing the ping signal to a transmitter terminal. The ping signal has a plurality of parameters including at least one of frequency, duty cycle, and phase shift angle, and at least one of the plurality of parameters varies with time. The method further includes monitoring at least one of a current of the power supply and a current at the transmitter terminal to determine if an eligible object is in the charging area.

In another embodiment, the present invention provides an apparatus for detecting objects in a charging area of a wireless charging transmitter. The apparatus includes a bridge circuit, a transmitter terminal, a detection circuit, and a determination circuit. The bridge circuit is coupled to a power supply for receiving a supply voltage. The bridge circuit generates a ping signal that has a plurality of parameters including frequency, duty cycle, and phase shift angle. The bridge circuit generates the ping signal such that at least one of the parameters varies over time. The transmitter terminal is coupled to the bridge circuit and receives the ping signal. The detection circuit detects at least one of a current of the power supply and a current at the transmitter terminal. The determination circuit is connected to the detection circuit, and determines, in response to the at least one of the currents detected by the detection circuit, if an eligible object is in the charging area.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
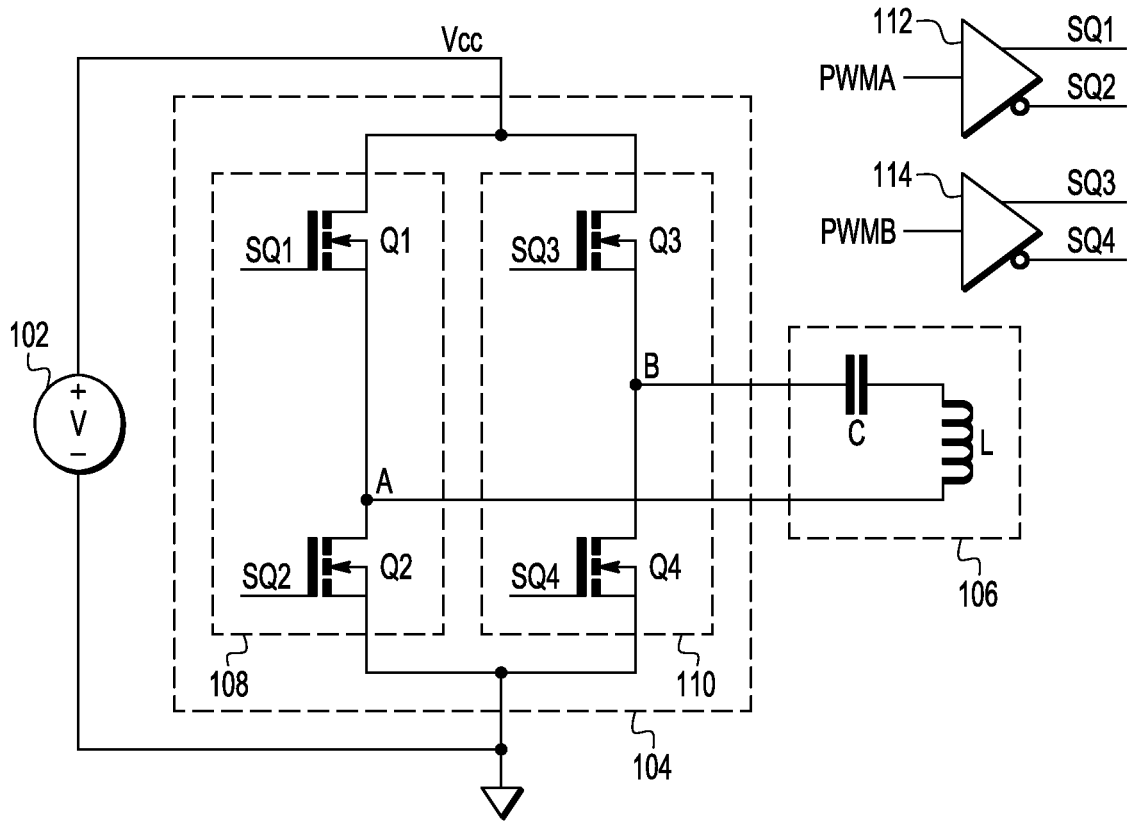
FIG. 1 is a schematic circuit diagram of a portion of a wireless charging apparatus in accordance with an embodiment of the present invention.

FIG. 1 shows a schematic circuit diagram of an apparatus 100 for detecting the presence of an object in a charging area of a wireless charging transmitter. The apparatus 100 includes a power supply 102, a bridge circuit 104, and a transmitter terminal 106. The power supply 102 is coupled to the bridge circuit 104 and provide the bridge circuit 104 with a voltage Vcc. The bridge circuit 104 includes parallel connection of a first branch 108 and a second branch 110. Each of the first and second branches 108 and 110 are coupled with the power supply 102. In the current embodiment, the bridge circuit 104 is implemented as a full-bridge circuit. In alternative embodiments, the bridge circuit 104 can be implemented as a half-bridge circuit, including only one of the first and second branches 108 or 110.

The first branch 108 includes a first transistor Q1 and a second transistor Q2, while the second branch 110 includes a third transistor Q3 and a fourth transistor Q4. Each of the transistors Q1, Q2, Q3, and Q4 includes a gate terminal and two current electrodes. In the first branch 108, one of the current electrodes of the first transistor Q1 is coupled to the power supply 102, the other current electrode of the first transistor Q1 is coupled to one of the current electrodes of the second transistor Q2. The other current electrode of the second transistor Q2 is coupled to ground. In the second branch 110, one of the current electrodes of the third transistor Q3 is coupled to the power supply 102, and the other current electrode of the third transistor Q3 is coupled to one of the current electrodes of the fourth transistor Q4. The other current electrode of the fourth transistor Q4 is coupled to ground. Thus, Q1 and Q2 are connected in series between Vcc and ground, Q3 and Q4 are connected in series between Vcc and ground, and Q1 and Q2 are connected in parallel with Q3 and Q4.

Each of the transistors Q1 to Q4 is switched by corresponding control signals SQ1 to SQ4 respectively provided to the gate terminals thereof. In the current embodiment, the first branch 108 further comprises a first control circuit (Ctrl_A) 112, and the second branch 110 comprises a second control circuit (Ctrl_B) 114. The first control circuit Ctrl_A 112 includes an input terminal and two output terminals. Each of the output terminals of the first control circuit Ctrl_A 112 is coupled with a corresponding gate terminal SQ1 or SQ2 of the first and second transistors Q1 and Q2. Similarly, the second control circuit Ctrl_B 114 includes an input terminal and two output terminals, and each of the output terminals of the second control circuit Ctrl_B 114 is coupled with a corresponding gate terminal SQ3 or SQ4 of the third transistors Q3 and Q4. In applicable embodiments, the first and second control circuits Ctrl_A and Ctrl_B are implemented as buffer circuits, and the two output terminals are configured to provide complementary versions of the buffered signals (i.e., SQ2=/SQ1, and SQ4=/SQ3). For detecting objects in a charging area of the transmitter terminal 106, the bridge circuit 104 generates a ping signal, at a node A between the current electrodes of the first and second transistors Q1 and Q2 and a node B between the current electrodes of the third and fourth transistors Q3 and Q4. In embodiments where the bridge circuit 104 is implemented as a half-bridge circuit, node B can be coupled to ground.

The transmitter terminal 106 includes two input terminals respectively coupled to nodes A and B. In one embodiment, the transmitter terminal 106 includes a capacitor C, and an inductor L connected in series with the capacitor C. As described above, the ping signal generated by the bridge circuit 104 causes the transmitter terminal 106 to resonate, and thereby emit wireless charging power.

Figure 2:
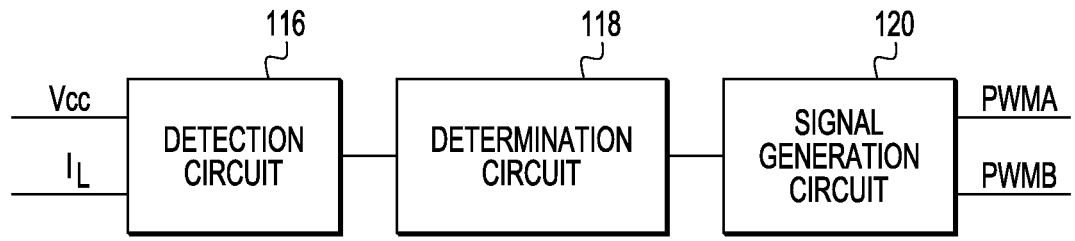
FIG. 2 is a schematic block diagram of another portion of the wireless charging apparatus of the present invention.

FIG. 2 is a schematic block diagram of another part of the apparatus 100. The apparatus 100 further includes a detection circuit 116, a determination circuit 118, and a signal generation circuit 120. The detection circuit 116 is coupled with at least one of the power supply 102 and the transmitter terminal 106. The detection circuit 116 detects at least one of a current of the power supply 102 and a current of the transmitter terminal 106. The current of the transmitter terminal 106 refers to the current through the inductor L ($I_L$). The determination circuit 118 is coupled to the detection circuit 116 and receives the detected current, and determines if an eligible object is in the charging area of the wireless charging transmitter. As described above, the determination circuit 118 determines if an object is present on the transmitter surface, or determines if the object on the transmitter surface moves, when the ping signal is an analog ping. As also described above, the determination circuit 118 determines if the object on the transmitter surface is an eligible receiver when the ping signal is a digital ping signal. The signal generation circuit 120 is coupled to the determination circuit 118. The signal generation circuit 120 generates trigger signals (PWMA and PWMB) that are provided to the input terminals of the first and second control circuits 112 and 114 of the bridge circuit 104.

Figure 3:
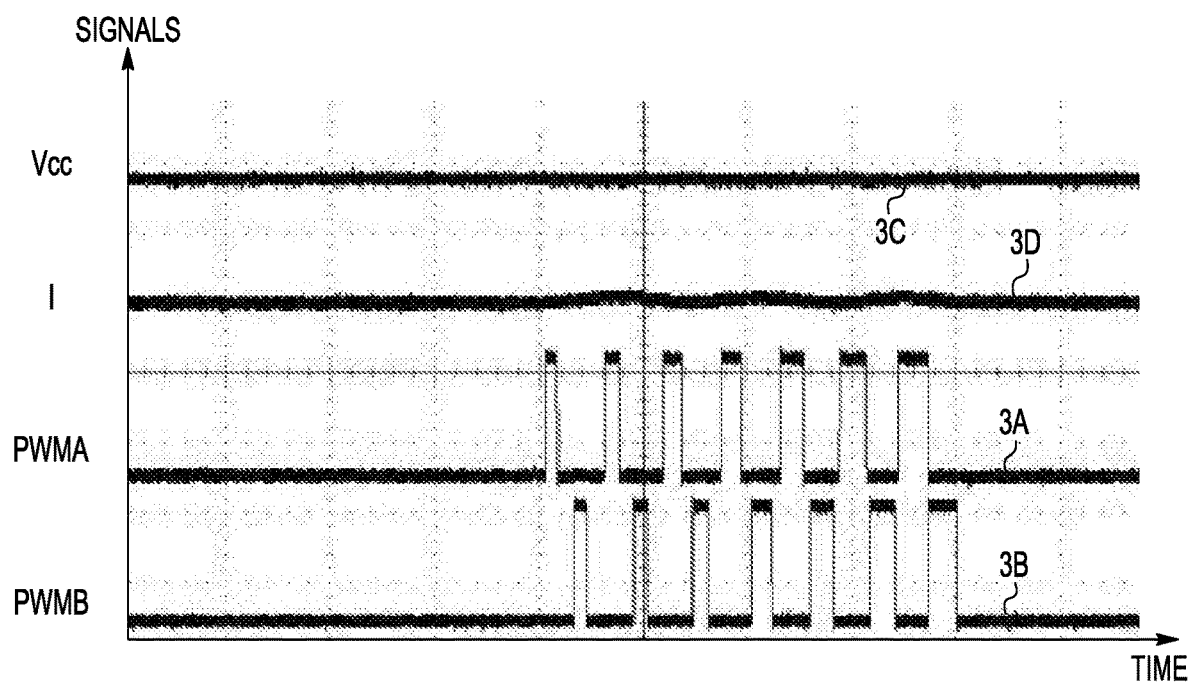
FIG. 3 is a graph of signals at several nodes of the apparatus of FIGS. 1 and 2 when using an analog ping signal for the detection of an object.

Referring now to FIG. 3, which is a graphic showing traces of signals at several nodes of the apparatus when using an analog ping for the detection. In FIG. 3, trace 3A indicates the signal PWMA at the input terminal of the first control circuit Ctrl_A 112, trace 3B indicates the signal PWMB at the input terminal of the second control circuit Ctrl_B 114, trace 3C indicates the voltage of the power supply 102, and trace 3D indicates the current at the power supply 102.

As illustrated in FIG. 3, the analog ping is generated by providing the first and second control circuits Ctrl_A 112 and Ctrl_B 114 with a limited number of pulses. In the full-bridge circuit shown in FIG. 1, the pulses provided to the control circuits Ctrl_A 112 and Ctrl_B 114 are complementary. Taking the signal PWMA 3A as an example, at least one of a plurality of parameters of the input signal PWMA provided to the input terminal of the first control circuit Ctrl_A 112 varies with time. The plurality of parameters include: frequency, duty cycle, phase shift angle, etc. It should be understood that with the bridge circuit shown in FIG. 1, the ping signal generated has the same varying parameter as the input signal PWMA. "At least one of a plurality of parameters" means that the input signal PWMA provided by the signal generation circuit 120 can have its several parameters vary as described below.

In one embodiment, the input signal PWMA is started with an initial frequency, for example 200 kHz. The frequency is maintained for at least the first cycle of the input signal PWMA. Subsequently, in the following cycle, the frequency is decreased by a predetermined amount, for example 5 kHz, to 195 kHz. The frequency of the input signal PWMA is decreased cycle by cycle before the input signal is stopped. In a presently preferred embodiment, for analog ping, the input signal PWMA has 5 or 6 cycles.

In another embodiment, the input signal PWMA is started with an initial duty cycle, for example 20%. The duty cycle is maintained for at least the first cycle of the input signal PWMA. Subsequently, in the next cycle, the duty cycle is increased by a predetermined amount, for example 10%, so that the duty cycle changes from 20% to 30%. The duty cycle of the input signal PWMA is increased cycle by cycle n this manner before the input signal is stopped. Preferably, for analog ping, the input signal PWMA has 5 or 6 cycles.

For the full-bridge circuit shown in FIG. 1, the pulses of the input signals PWMA and PWMB are staggered, resulting in a phase shift angle therebetween. In one embodiment, the input signals PWMA and PWMB are provided with an initial phase shift angle, and then the phase shift angle is increased in the following cycles. As described above, one or more of the parameters of the input signals is varied in this way.

Figure 4:
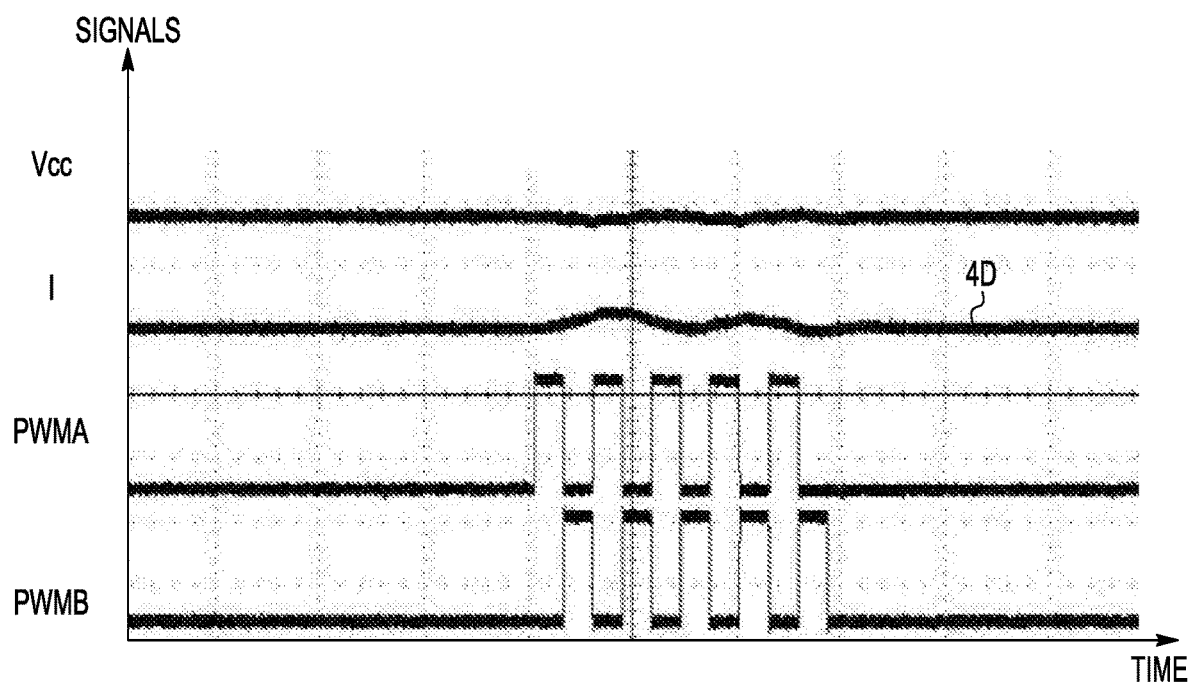
FIG. 4 is a graph of signals at several nodes of an apparatus when using an analog ping signal with no varying parameters for the detection of an object.

For detecting the presence of an object or a movement of the object, the analog ping is triggered periodically, for example every 400 ms. As described above, the analog ping normally has a limited number of pulses, for example 5 or 6 pulses. Considering the frequency of the signal to be around 200 kHz, the analog ping usually lasts for about 50 us to 200 us. The analog ping thus consumes little energy. Trace 3D illustrates the current of the power supply 102 when there is no object on the Tx surface. Because the one or more parameters of the input signals PWMA and PWMB varies over time, the power supply current slightly increases with the initiation of the analog ping signal. As a comparison, FIG. 4 shows the traces of the same signals for an analog ping when the signal parameters are unchanged. It can be seen from FIG. 4 that, along with the initiation of the ping signal, the power supply current 4D increases at an amplitude larger than that of trace 3D of FIG. 3.

Figure 5:
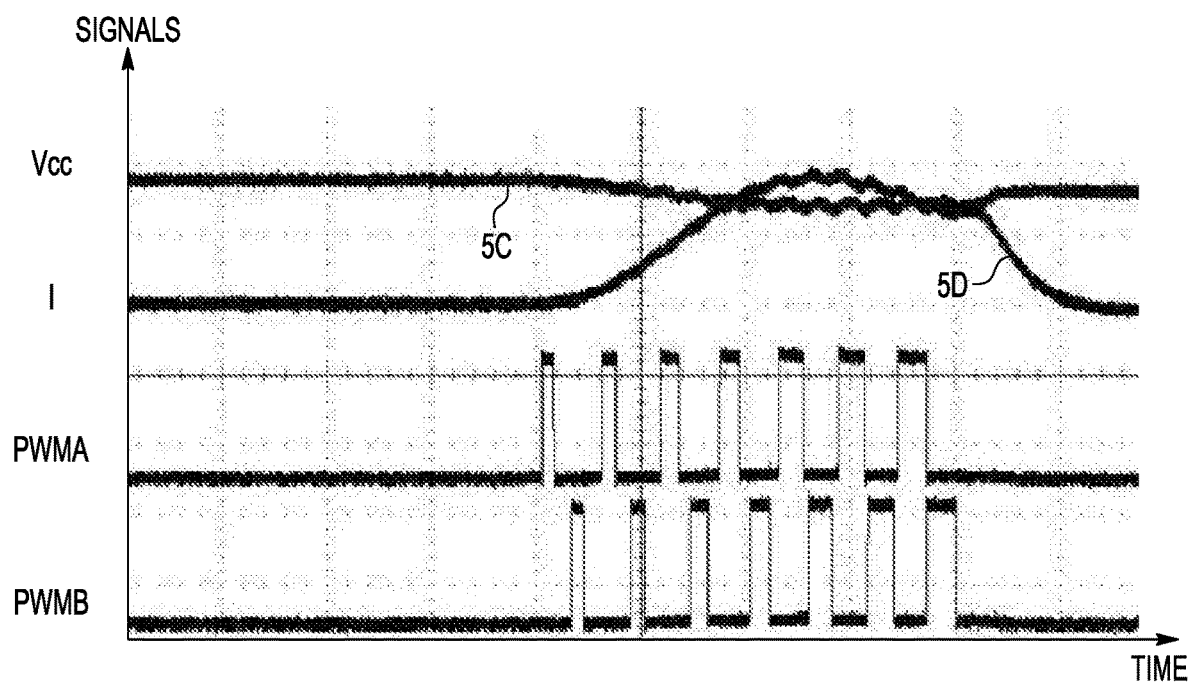
FIG. 5 is a graph of signals at several nodes of the apparatus of FIGS. 1 and 2 when using an analog ping signal for the detection of an object when there is a large metal object present.

FIG. 5 shows traces of the signals when using the analog ping for object detection when there is a large metal object on the Tx surface. When a large metal object is present on the Tx surface, the induction will decrease the supply voltage Vcc, as indicated by trace 5C. In the meantime, the power supply current will increase, as indicated by trace 5D. However, according to the present invention, at least one of the parameters of PMWA is varied over time, so the changes in the amplitudes of the power supply voltage and power supply current are not as great as if a parameter of PMWA is not changed over time.

Figure 6:
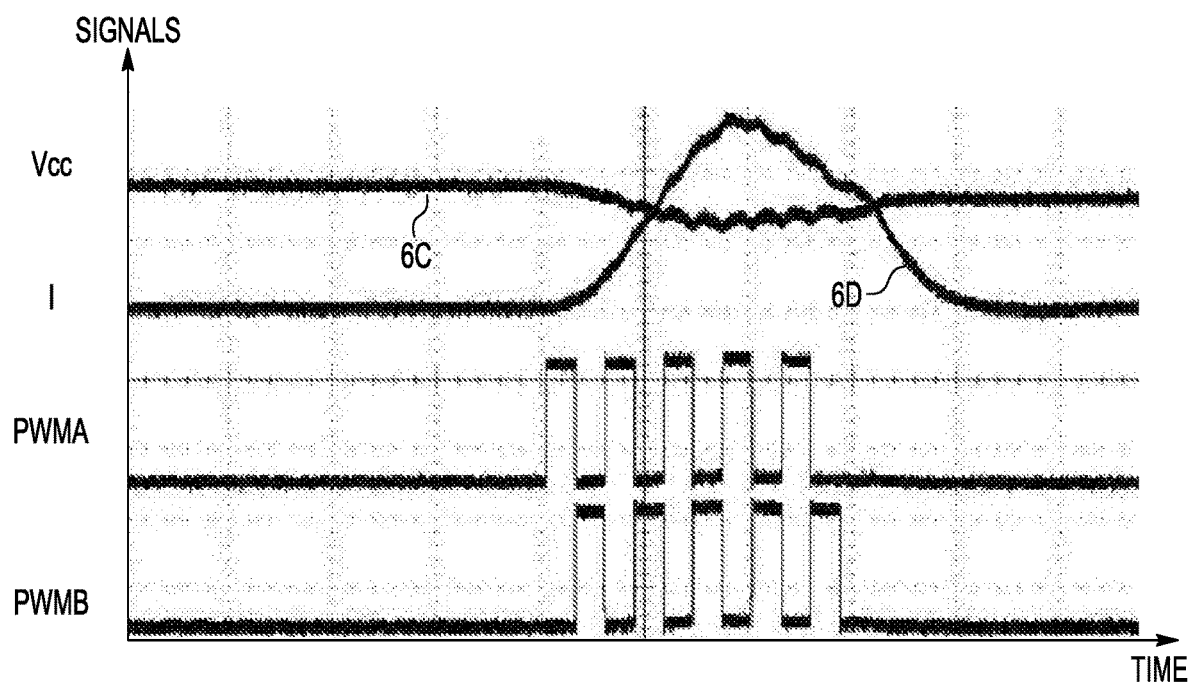
FIG. 6 is a graph of signals at several nodes of an apparatus when using another analog ping signal with no varying parameters for the detection of an object when there is a large metal object present.

As a comparison, FIG. 6 shows an analog ping when there is a large metal object in the Tx area (i.e., same condition as FIG. 5) if an analog ping in which the signal parameters are not changed is used. FIG. 6 shows that the amplitudes of both the decrease of the supply voltage Vcc (trace 6C) and the increase of the power supply current (trace 6D) is much larger than those in FIG. 5.

With the comparisons between FIGS. 3 and 4, and FIGS. 5 and 6, it can be seen that analog pings with at least one of the parameters varying over time can prevent overly large changes in the power supply voltage Vcc and power supply current (I), especially when a large metal object is present in the charging area.

The detection circuit 116 detects the power supply current ($I_L$), and provides the detected value to the determination circuit 118. The determination circuit 118 compares the detected value with predetermined threshold values. In one embodiment, if the determination circuit 118 finds that the power supply current exceeds a first predetermined threshold, then it determines that an object is present in the charging area. In another embodiment, if the determination circuit 118 finds the power supply current exceeds a second predetermined threshold, a stop signal is provided to the signal generation circuit 120 to stop the supply of the input signals PWMA and PWMB, and subsequently the analog ping stops, which prevents the apparatus 100 from generating overly large current that could potentially cause undesired harm or damage to the charger, the charging circuitry, or the detected object.

Figure 7:
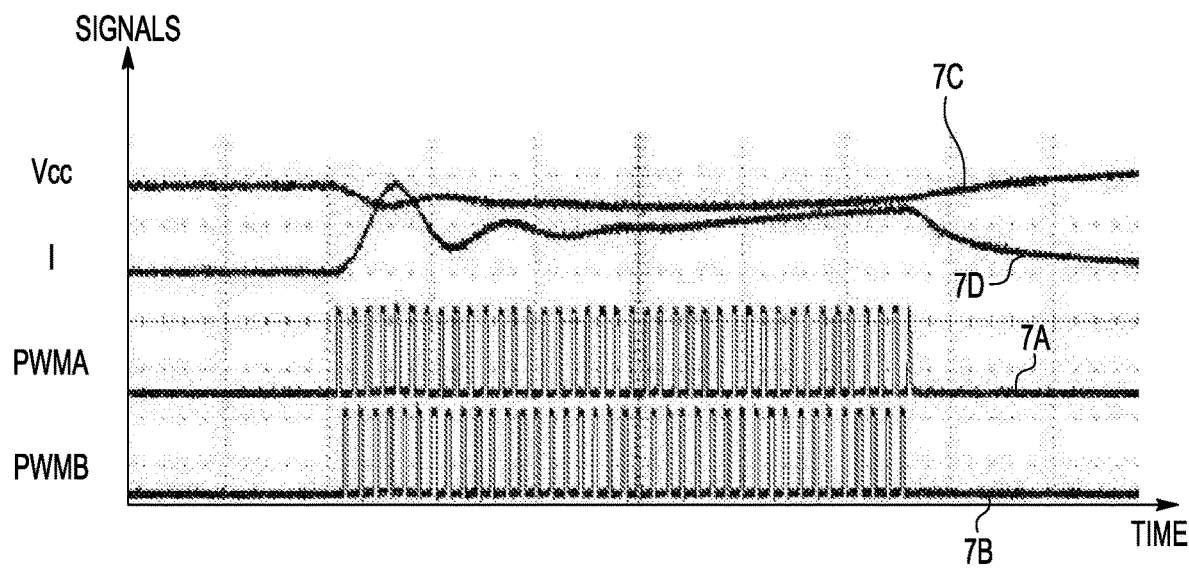
FIG. 7 is a graph of signals at several nodes of the apparatus of FIGS. 1 and 2 when using a digital ping signal for the detection of a receiver when there is a large metal object present.

Referring to FIG. 7, traces of the signals when using a digital ping in accordance with an embodiment of the present invention for object detection are shown. The digital ping can be used after the presence of an object in the charging area is detected using an analog ping (e.g., determined through the analog ping as described above). The digital ping can be provided periodically, such as every 2 seconds, and lasts for about 70 ms. The apparatus 100 uses the digital ping to wake-up the receiver on the Tx surface. For example, an eligible receiver sends information signals to the transmitter so that the transmitter can determine whether to continue the charging or stop. In one embodiment, at least one of the parameters of the input signals PWMA and PWMB is varied over time. Generally, the digital ping is provided with a low initial frequency, a low initial duty cycle, and/or a low initial phase shift angle, or any combination thereof. FIG. 7 illustrates the signal traces when there is a large metal object present on the Tx surface. The power supply voltage Vcc (trace 7C) drops, while the power supply current (trace 7D) increases. The detection circuit 116 detects the changes in the power supply voltage and current and the determination circuit 118 compares these voltage and current values with predetermined parameters, as discussed above. Based on the comparisons performed by the determination circuit 118, as shown in FIG. 7, after about 250 us, the determination circuit 118 causes the signal generation circuit 120 to stop the digital ping.

Figure 8:
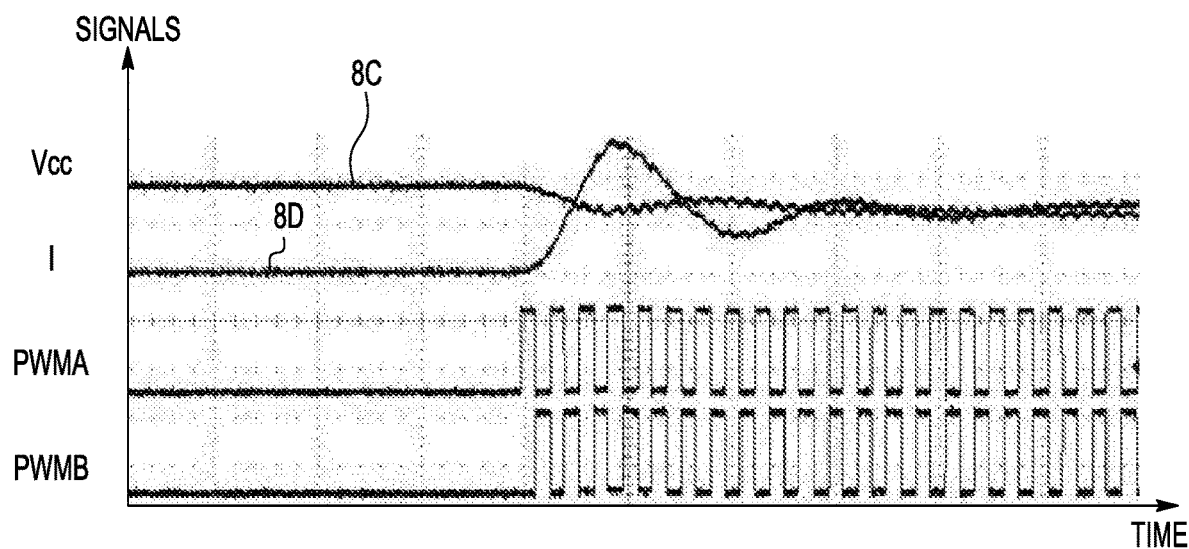
FIG. 8 is a graph of signals at several nodes of an apparatus when using a digital ping signal with no varying parameters for the detection of a receiver when there is a large metal object present.

FIG. 8 shows the signal traces when there is a large metal object on the Tx surface and a prior art transmitter is used. It can be seen that the power supply current (trace 8D) for an apparatus that generates digital pings having relatively large frequency, duty cycle, or phase shift angle, the amplitude of the current pulse is greater than when the circuit of the present invention is used—compare to FIG. 7. Further, the prior art circuit does not stop the digital ping even in the presence of large changes in amplitude of the power supply voltage and current.

The low parameters of the digital ping are maintained for a time before one or more of them are changed (increased or decreased). The maintaining time is preferably 3 ms. The parameters can be changed in various ways. For example, the apparatus 100 can increase all parameters step by step for a next cycle based on the signal parameter values in the previous cycle. In other examples, the apparatus 100 can increase one of the parameters in one of the cycles, and increase another parameter in a next cycle. In still other examples, the apparatus 100 can increase one or more parameters in one cycle, and keep all the parameters for some cycles, and then continue the increase. Preferably, each increase of the one or more of the parameters takes place within 1-2 ms, for avoidance of any chaos.

Although it is described above that the determination circuit 118 determines the existence of the object or the eligibility of the receiver from the detected power supply current, it will be understood by those of skill in the art that the determination is also possible through the detected current of the inductor L.

In operation of the apparatus 100, the signal generation circuit 120 periodically generates the input signals PWMA and PWMB to trigger the bridge circuit 104 to provide the analog ping. The apparatus 100 uses the analog ping to detect the existence of an object in the charging area of the charging transmitter. Because the analog ping is relatively short in duration and is triggered periodically, for example every 400 ms, the apparatus 100 consumes little energy. If the apparatus 100 determines, using the analog ping, that an object is present in the charging area, the digital ping is triggered to detect if the object is an eligible receiver. Notwithstanding the sequence of the analog ping and the digital ping, over-current detection is operated for both the analog ping and digital ping to avoid any damage or unwanted noise. After the eligibility of the Rx is determined, the transmitter terminal 106 is used to transmit charging power, and the digital ping is triggered periodically to monitor for any abnormal situation with the receiver Rx, for example every 2 seconds.

It can now be seen that the embodiments of the present invention trigger either the analog ping and the digital ping with varying parameters. The apparatus prevents excessive large current from being generated in abnormal situations like large metal object being present. Moreover, as compared to ping signals with constant parameters, the ping signals with varying parameters enable the apparatus to be power efficient.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A method for detecting an object in a charging area of a wireless charging transmitter, the method comprising:
   supplying a bridge circuit with power from a power supply;
   generating an analog ping signal by the bridge circuit to have a plurality of parameters including at least one of frequency, duty cycle, and phase shift angle, wherein at least one of the plurality of parameters varies with time when generating the analog ping signal before receiving a communication signal from an object in the charging area;
   providing the analog ping signal to a transmitter terminal; and
   monitoring at least one of a current of the power supply and a current at the transmitter terminal for a signal response to the analog ping signal to determine if an object is present or moving in the charging area.

2. The method of claim 1, wherein the monitoring step further comprises:
   determining if the at least one of the power supply current and the current at the transmitter terminal exceeds a predetermined value; and
   determining an existence of an object in the charging area if the at least one of the power supply current and the current at the transmitter terminal exceeds the predetermined value.

3. The method of claim 2, wherein the analog ping signal has a limited number of pulses.

4. The method of claim 3, wherein the number of pulses is 4 or 5.

5. The method of claim 2, wherein the frequency of the analog ping signal decreases over time.

6. The method of claim 5, wherein an initial frequency of the analog ping signal is about 200 kHz, and the frequency of the analog ping signal decreases by about 5 kHz per pulse.

7. The method of claim 2, wherein the duty cycle of the analog ping signal increases over time.

8. The method of claim 7, wherein an initial duty cycle of the analog ping signal is 20%, and the duty cycle increases by 10% each pulse.

9. The method of claim 2, wherein the phase shift angle of the analog ping signal increases over time.

10. The method of claim 1, wherein the monitoring step further comprises:
    determining if the at least one of the power supply current and the current at the transmitter terminal exceeds a corresponding threshold; and
    stopping the generation of the analog ping signal if the at least one of the power supply current and the current at the transmitter terminal exceeds its corresponding threshold.

11. The method of claim 10, wherein the frequency of the analog ping signal increases over time.

12. The method of claim 10, wherein the duty cycle of the analog ping signal increases over time.

13. The method of claim 10, wherein the phase shift angle of the analog ping signal increases over time.

14. The method of claim 10, wherein the at least one of the plurality of parameters of the analog ping signal is held for a predetermined time before the analog ping signal changes.

15. The method of claim 14, wherein the predetermined time is 3 ms.

16. The method of claim 10, wherein the at least one of the plurality of parameters of the analog ping signal varies within 2 ms.

17. The method of claim 1, further comprising:
    generating, in response to determining that there is an object present or moving in the charging area, a digital ping signal by the bridge circuit to have a plurality of parameters including at least one of frequency, duty cycle, and phase shift angle which varies with time;
    providing the digital ping signal to the transmitter terminal; and
    monitoring at least one of a current of the power supply and a current at the transmitter terminal generated in response to the digital ping signal to determine if the object present or moving in the charging area is an eligible object.

18. An apparatus for detecting objects in a charging area of a wireless charging transmitter, the apparatus comprising:
    a bridge circuit coupled to a power supply for receiving a supply voltage, wherein the bridge circuit generates an analog ping signal having a plurality of parameters including at least frequency, duty cycle, and phase shift angle, and wherein the bridge circuit generates the analog ping signal such that at least one of the plurality of parameters of varies over time before receiving a communication signal from an object in the charging area;

a transmitter terminal coupled to the bridge circuit for receiving and transmitting the analog ping signal;

a detection circuit that detects at least one of a current of the power supply and a current at the transmitter terminal; and a determination circuit, connected to the detection circuit, that determines, in response to the at least one of the currents detected by the detection circuit, if an object is present or moving in the charging area.

19. The apparatus of claim 18, wherein:
the bridge circuit is configured to generate the analog ping signal to have a limited number of pulses, and
the analog ping signal is characterized with at least one of (i) a decreasing frequency over time; (ii) an increasing duty cycle over time; and (iii) an increasing phase shift angle when the bridge circuit is a full-bridge circuit.

20. The apparatus of claim 18, wherein:
the bridge circuit stops generating the analog ping signal if the at least one of the power supply current and the current at the transmitter terminal exceeds a predetermined threshold, and
the bridge circuit generates the analog ping signal with at least one of (i) an increasing frequency over time; (ii) an increasing duty cycle over time; and (iii) an increasing phase shift angle over time.

21. The apparatus of claim 18, wherein the bridge circuit comprises:
a first transistor (Q1) having a source a first terminal connected to the power supply and a gate terminal that receives a first input signal (SQ1);
a second transistor (Q2) having a first terminal connected to a second terminal of the first transistor, a second terminal connected to ground, and a gate terminal that receives a complement of the first input signal;
a third transistor (Q3) having a first terminal connected to the power supply and a gate terminal that receives a second input signal (SQ3);
a fourth transistor (Q4) having a first terminal connected to a second terminal of the third transistor, a second terminal connected to ground, and a gate terminal that receives a complement of the second input signal;
a capacitor having a first terminal connected to a node between the third and fourth transistors; and
an inductor having a first terminal connected to a second terminal of the capacitor, and a second terminal connected to a node between the first and second transistors.

* * * * *